United States Patent
Weidman et al.

(10) Patent No.: US 6,989,227 B2
(45) Date of Patent: Jan. 24, 2006

(54) E-BEAM CURABLE RESIST AND PROCESS FOR E-BEAM CURING THE RESIST

(75) Inventors: Timothy Weidman, Sunnyvale, CA (US); William R. Livesay, San Diego, CA (US); Matthew F. Ross, San Diego, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/447,729

(22) Filed: May 28, 2003

(65) Prior Publication Data

US 2003/0228538 A1    Dec. 11, 2003

Related U.S. Application Data

(60) Provisional application No. 60/386,966, filed on Jun. 7, 2002.

(51) Int. Cl.
  *G03F 7/075*   (2006.01)
  *G03F 7/027*   (2006.01)
  *G03F 7/039*   (2006.01)
  *G03F 7/40*    (2006.01)
  *G03F 7/38*    (2006.01)

(52) U.S. Cl. ............. 430/287.1; 430/281.1; 430/270.1; 430/296; 430/286.1; 430/285.1; 430/330; 430/323

(58) Field of Classification Search ......... 430/269–311
   See application file for complete search history.

(56) References Cited

U.S. PATENT DOCUMENTS

| | | | |
|---|---|---|---|
| 3,594,170 A * | 7/1971 | Broyde .................. 430/296 |
| 3,666,473 A | 5/1972 | Colom et al. .................. 96/91 |
| 3,770,433 A * | 11/1973 | Bartelt et al. ............... 430/296 |
| 4,041,190 A * | 8/1977 | Dubois et al. .............. 430/296 |
| 4,115,128 A | 9/1978 | Kita .............................. 96/91 |
| 4,173,470 A | 11/1979 | Fahrenholtz et al. ........... 430/5 |
| 4,286,049 A * | 8/1981 | Imamura et al. ............ 430/296 |
| 4,690,838 A | 9/1987 | Hiraoka et al. ............. 427/343 |
| 4,764,247 A * | 8/1988 | Leveriza et al. ............ 438/725 |
| 5,003,178 A | 3/1991 | Livesay ................... 250/492.3 |
| 5,260,349 A * | 11/1993 | Crivello ....................... 522/170 |
| 6,150,070 A | 11/2000 | Minter et al. ............... 430/296 |
| 6,218,090 B1 | 4/2001 | Minter et al. ............... 430/394 |
| 6,255,035 B1 | 7/2001 | Minter et al. ............... 430/312 |
| 6,319,655 B1 | 11/2001 | Wong et al. ................ 430/311 |

FOREIGN PATENT DOCUMENTS

| DE | 25 43 553 A1 * | 3/1977 |
| EP | 1 099 983 A1 * | 5/2001 |

OTHER PUBLICATIONS

Steppan et al, Ullmann's Encyclopedia of Industrial Chemistry, "Imaging Technology. 4. Imaging for Electronics" posted on lin on Mar. 15, 2003, Wiley-VCH Verlag GmbH & Co. KGaA, 19 pages.*

(Continued)

*Primary Examiner*—Cynthia Hamilton
(74) *Attorney, Agent, or Firm*—Janah & Associates

(57) ABSTRACT

One embodiment of the present invention is a photoresist formulation that includes e-beam cross-linkable substituents, which substituents include one or more of the following functional groups: (a) carbon-carbon double bonds; (b) a strained ring system; (c) a halogenated compound; and (d) one or more organo-silicon moieties.

11 Claims, 5 Drawing Sheets

Methacrylate Type:

Hybrid Type:

OTHER PUBLICATIONS

"Ring Systems" IUPAC (International Union of Pure and Applied Chemistry), Glossary of Class Names, 199 2 pages of 2 and 10 pages of 10 from http://www.cem.qmul.ac.uk/iupac/class.*

Morrison et al, Organic Chemistry, Third Edition, Allyn and Bacon, Inc, Boston, MA, 1973, pp. 562-564.*

Macintyre et al, Microelectronic Engineering, 35 (1997) 213-216.* van Delft et al , Microelectronic Engineering 46 (1999) 383-387.*

Thoms et al , Microelectronic Engineering 46 (1999) 287-290.*

AN 1977:460816, CAPLUS, ACS on STN, entered into STN on May 1984, English Abstract of Buchmann et al DE-2543553 A dated Mar. 31, 1977 along with registry numbers cited from Registry file obtained from ACS on STN.*

Derwent-ACC-No.: 1977-23816Y, Licetia Patent-VerwGMBH [LICN], abstract of Buchmann et al DE-2543553 A1 dtaed Mar. 31, 1977.*

Ross et al "Chemical Analysis of Electron Beam Curing of Positive Photresist", SPIE vol. 2195, pp. 834-848, May 1994.*

Harada et al, "Temperature Effects on Positive electron Resists Irradiated with Electron Beam and Deep-UV Light", Journal of Applied Polymer Science, vol. 27, 1441-1452 (1982), John Wiley & Sons, Inc.*

"Organic Imaging Materials, A View of the Future" by M. D. Stewart et al., *J. Phys. Org. Chem.*, 2000; 13: pp. 767-774.

157nm Resist Materials: Progress Report by C. Brodsky et al., *J. Vac. Sci. Technol.*, B 18(6), Nov./Dec. 2000, pp. 3396-3401.

"Synthesis of Siloxanes and Silsesquioxanes for 157nm Microlithography" by Hoang V. Tran, et al., *Polymeric Materials: Science & Engineering*, 2001, p. 84.

Morrison et al; "Organic Chemistry" Allyn and Bacon Inc., pp. 562-564.

G.P. Moss et al.; "Glossary of Class Names of Organic . . . " IUPAC (Recommendations 1994), pp. 1-2.

Steppan et al.; "Imaging Technology" Ullmann's Encyclopedia of Industrial Chemistry, Mar. 15, 2003; pp. 1-19.

Ring Systems; pp. 1-10.

Macintyre et al.; "High Resolution Electron Beam Lithography.." Microelectronic Engineering 35 (1997) pp. 213-216.

Van Delft et al; "DUV Resists in negative tone high . . . " Microelectronic Engineering 46, (1999) pp. 383-387.

Thomas et al.; "Process Optimisation of DUC Photresists.." Microelectronic Engineering 46 (1999) pp. 287-290.

* cited by examiner

FIG. 5
Methacrylate Type:
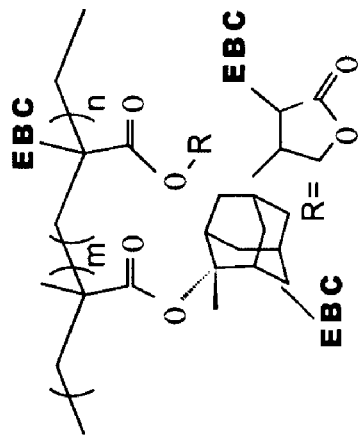
Hybrid Type:
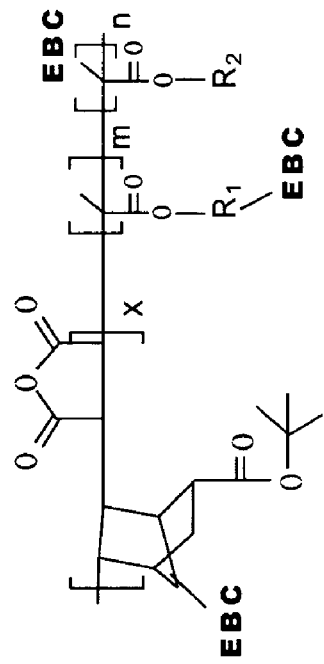

E-BEAM CURABLE RESIST AND PROCESS FOR E-BEAM CURING THE RESIST

This application claims the benefit of U.S. Provisional Application No. 60/386,966, filed on Jun. 7, 2002 which application is incorporated herein by reference.

TECHNICAL FIELD OF THE INVENTION

One or more embodiments of the present invention relate to photoresist formulations used to fabricate electronic devices such as integrated circuits ("ICs"), and method and apparatus to stabilize such photoresist formulations. In particular, one or more embodiments of the present invention relate to methods and apparatus for increasing the etch resistance of photoresists that are suitable for use in fabricating electronic devices such as ICs. In further particular, one or more embodiments of the present invention relate to a method for increasing the etch resistance of positive working, chemically amplified, photoresists such as, for example, and without limitation, 193 nm, 157 nm, deep-UV (248 nm), x-ray sensitive, and electron beam sensitive resists while improving and maintaining fidelity of lithographic features and critical dimensions.

BACKGROUND OF THE INVENTION

The ability to reproduce very small dimensions is important in fabricating large scale integrated circuits ("ICs") on, for example, silicon wafers or substrates. One way to increase circuit density on a wafer or substrate is to increase the resolution capabilities of photoresist used to form photoresist film patterns. Thus, as the integration degree of ICs becomes higher, finer photoresist film patterns are required.

Photoresists are either positive working or negative working. In using a negative working photoresist ("negative photoresist"), radiation-exposed areas harden, and form image areas of the photoresist after unexposed areas are removed using a developer. In using a positive working photoresist ("positive photoresist"), however, radiation-exposed areas are non-image areas, and are rendered soluble in aqueous alkali developers. Positive photoresists have been found to be capable of higher resolution than negative photoresists, and as a result, positive photoresists have mostly replaced negative photoresists in fabricating ICs.

The production of positive photoresists is well known in the art, as disclosed, for example, in U.S. Pat. Nos. 3,666,473; 4,115,128; and 4,173,470. As disclosed therein, a typical positive photoresist formulation comprises aqueous alkali soluble polyvinyl phenol or phenol formaldehyde novolak resins, and light sensitive materials ("photosensitizers")—usually a substituted naphthoquinone diazide compound. In use, the resins and photosensitizers are dissolved in an organic solvent, and are applied as a thin film coating to a substrate suitable for a particular application.

As is known, the resin component of such a positive photoresist formulation is soluble in an aqueous alkaline solution, but the photosensitizer is not. Upon image-wise exposure of the coated substrate to actinic radiation, exposed areas of the coating are rendered more soluble than unexposed areas. This difference in solubility causes the exposed areas of the photoresist coating to be dissolved when the substrate is immersed in an alkaline developing solution (while the unexposed areas are substantially unaffected), thus producing a positive image on the substrate. The uncovered substrate is thereafter subjected to an etching process. In use, the photoresist coating protects covered areas of the substrate from the etchant. Thus, a pattern can be created on the substrate that corresponds to the pattern of the mask or template used to create selective exposure patterns on the coated substrate prior to development.

An optimally obtainable microlithographic resolution for an exposure pattern is determined by the wavelength of the radiation used for selective irradiation. As a result, the resolution capacity that can be obtained with conventional UV microlithography has its limits, and in order to sufficiently resolve optically small structural elements, wavelengths shorter than UV radiation must be utilized. However, UV photoresist materials used today are not suitable for use with radiation at wavelengths of 157 nm, 193 nm or 248 nm. This is because materials based on phenolic resins as a binding agent (particularly novolak resins or polyhydroxystyrene derivatives) have too high an absorption at such wavelengths, and cannot be imaged through films of the thicknesses needed to fabricate ICs (for example, polyhydroxystyrene based photoresists can be used in top surface imaging applications in which only a very thin (~500 Å) layer of photoresist is required to be transparent at the wavelength of an ArF laser, i.e., $\lambda \sim 193$ nm). Such high absorption results in side walls of developed photoresist structures that do not form vertical profiles. Rather the side walls form an oblique angle with respect to the substrate, and this causes poor optical resolution characteristics at these short wavelengths.

To solve the above-described problem, chemical amplification photoresists have been developed that have been found to provide superior resolution. For 157 nm, 193 nm, and 248 nm photoresist technologies, chemical amplification is used to achieve high "photo" speed at the low exposure energies provided by the selected wavelength sources. The basic photoresist design concept for such photoresists is to start with a resin that has good transparency at the selected wavelength—the resin must also be highly insoluble in an aqueous base developer chemistry. To make the resin insoluble in such a developer, dissolution inhibitors (sometimes called blocking or protecting groups) are attached to the resin. These protecting groups are usually very large, or bulky, molecules that are attached to the resin via bonds that can be easily cleaved. In most advanced photoresist systems, there are usually several types of molecules attached to the resin in addition to the dissolution inhibitors. These include molecules that are intended to enhance the etch resistance of the material, as well as molecules that are intended to help with lithographic performance. All of these molecules are attached to the resin via a link that is easily cleaved.

Chemical amplification is achieved by adding a small amount of a photo-acid generator (PAG). This is a compound that generates a proton ($H^+$) whenever it is exposed at the appropriate wavelength. These compounds are usually onium salts, such as sulfonium salts, but they can be any one of a number of suitable compounds. Whenever the PAG is exposed, and the proton is generated, the proton cleaves the nearest available bond between the resin and a dissolution inhibitor. This cleaving reaction generates another proton, which proton cleaves the next nearest bond, and so on. This is sometimes referred to as a de-protection reaction.

This de-protection reaction can occur during an optical exposure, for low activation energy photoresists, or during a subsequent post-exposure bake (PEB), for high activation energy photoresists. The result of the de-protection reaction is the formation of an acid, which acid is soluble in an aqueous base developer. In addition, as a result of cleaving the link between the resin and the blocking group, the blocking molecule usually leaves the photoresist as a volatile. In accordance with the above-described process, the chemically amplified photoresist can be fully exposed even though the incident optical exposure dose is very low, for example, on the order of about 10 to about 20 mJ/cm$^2$. Typically, the chemistry of such chemically amplified 157 nm, 193 nm or 248 nm photoresists is based on polymers such as, but not limited to, acrylates, cyclic olefins with alicyclic groups, and hybrids of the aforementioned polymers which lack aromatic rings. FIG. 1 shows an example of a methacrylate type and a hybrid type chemically amplified photoresist that are fabricated in accordance with the prior art, along with an example of a chemical amplification process used with of them.

However, there are problems associated with such chemically amplified photoresists. One problem is that such photoresists lack sufficient etch resistance, thermal stability, post exposure delay stability, and processing latitude to useful for fabricating ICs. In particular, while such photoresists are sufficiently transparent for deep UV radiation, they do not have the required etch resistance with respect to plasma etching that is evidenced by photoresists based on phenolic resins. This issue is compounded by the fact that the thickness of the photoresist is limited by pattern collapse issues at high aspect ratios, and the limited depth of focus of, for example, and without limitation, 193 nm photolithography tools. Because of this, as printed dimensions shrink, so too must the thickness of the photoresist shrink (for example, an aspect ratio of 3 or lower is necessary to prevent pattern collapse). However, lower photoresist thickness exacerbates the issue of etch resistance.

Another problem is that, after optical exposure and completion of the de-protection reactions, the photoresist in the exposed areas can shrink from ten to twenty percent. This is believed to be due to the loss of the bulky protecting groups as volatiles. This de-protection reaction does not occur in the unexposed areas. Thus, since the unexposed photoresist still contains resin with attached blocking groups, it is susceptible to shrinkage if these molecules are removed.

Due to the constraints of the photoresist design, and since the blocking groups are easily cleavable, the blocking groups can be removed by other reaction paths. One such reaction path entails thermal activation, where the photoresist is heated to a temperature that thermally breaks the bonds. This happens at different temperatures for different protection groups, but can be at a temperature as low as 40° C. to a temperature as high as 200° C. Thus, thermal activation may result in loss of blocking groups as volatiles, and a resulting shrinkage of the photoresist. The blocking groups can also be removed by other radiation sources including plasma discharges, or accelerated particles.

During electron beam exposure, a reaction similar to that occurring during optical exposure can occur. This reaction cleaves the link between the protecting groups and the resin, results in shrinkage of the photoresist. In addition, this reaction, and its associated photoresist shrinkage, is accelerated as the photoresist is heated by the energy of the incident electron beam. Since the full thickness of the photoresist is targeted for etch stabilization, substantial mass loss, and shrinkage, can result from the electron beam exposure. Further, because the interface between the photoresist and the substrate is constrained, the remainder of the photoresist shrinks in three dimensions. This leads to a phenomenon known as "pullback" where the top of the photoresist layer shrinks relative to the bottom. This effect is most pronounced on lithographic features such as contacts, line ends, and feature corners. The pullback phenomenon has undesired effects on features, which make them unacceptable for device fabrication.

Many different formulations of chemically amplified photoresists utilized for 193 nm exposure have been developed. Some examples of materials used for 193 nm lithography are disclosed in U.S. Pat. No. 6,319,655. For the next generation of lithography, new photoresist materials sensitive to 157 nm irradiation will be utilized for this application. Some of these materials are listed in an article entitled "Organic Imaging Materials, A View of the Future" by Michael Stewart et al., *J. Phys. Org. Chem.*, 2000; 13: pp. 767–774; an article entiled "157 nm Resist Materials: Progress Report" by Colin Brodsky et al., *J. Vac. Sci. Technol., B* 18(6), November/December 2000, pp. 3396–3401; and in an article entitled "Synthesis of Siloxanes and Silsesquioxanes for 157 nm Microlithography" by Hoang V. Tran, et al. *Polymeric Materials: Science & Engineering,* 2001, p. 84 (all of which articles are incorporated by reference herein). However, due to the volatility of additives in the disclosed photoresist materials, electron beam exposure causes expulsion of these additives, which, in turn, causes shrinking of the photoresist.

Several attempts have been made to solve the problem of lack of etch resistance of chemically amplified photoresists. One attempt to improve the etch resistance of such photoresists based on methacrylate polymers involved introducing cycloaliphatic groups into the methacrylate polymers. Although this improves the etch resistance, it does not do so to a required extent. One proposal to improve the etch resistance does so after a photoresist coating has been exposed and developed. For example, various strategies have been suggested involving the chemical derivation of patterned resist films by reaction with a gas or liquid phase reagent imparting increased etch resistance. Significant changes have been noted in processes resulting in the incorporation or doping with various metallic precursors, for example by reaction of patterned resist films with alkyl compounds of magnesium or aluminum (see U.S. Pat. No. 4,690,838). However, this is problematic because the use of metal-containing reagents introduce undesirable contaminants which are difficult to remove using conventional stripping procedures. U.S. Pat. No. 6,319,655, which is incorporated herein by reference, describes a process for improving the etch resistance of chemically amplified photoresists, and in particular 193 nm photoresists, using a large area electron beam exposure. Electron beam exposure of chemically amplified photoresists, and in particular 193 nm sensitive photoresists, has been shown to improve the etch resistance and thermal stability of these photoresists.

In addition, many attempts have been made to correct or eliminate the problem of photoresist deformation or pullback using different process steps with an electron beam exposure. One such attempt to minimize shrinkage used lower current density electron beam exposures; another such attempt to minimize shrinkage utilized surface curing of the photoresist (i.e., by lowering the energy of electrons such that only an upper portion of the photoresist received the electron beam exposure); still another such attempt to minimize shrinkage utilized higher doses of electrons aimed at a lower portion of the photoresist coating relative to an upper portion; and still yet another such attempt to minimize shrinkage utilized a lower flux electrons with longer exposure times to reduce the temperature of the photoresist during the electron beam exposure to no more than 50° C. to minimize photoresist heating effects. In addition, different formulations of photoresist have been utilized in an attempt to minimize expulsion of photoresist components, and thereby, shrinkage. All of these attempts have failed at reducing the pullback effect caused by an electron beam hardening process, see FIGS. 2–4.

In light of the above, there is a need for a photoresist, and a method and apparatus for treating it to address one or more of the above-identified issues.

SUMMARY OF THE INVENTION

One or more embodiments of the present invention advantageously satisfy one or more of the above-identified needs in the art. In particular, one embodiment of the present invention is a photoresist formulation that includes e-beam cross-linkable substituents, which substituents include one or more of the following functional groups: (a) carbon-carbon double bonds; (b) a strained ring systems; (c) a halogenated compound; and (d) one or more organo-silicon moieties.

BRIEF DESCRIPTION OF THE FIGURE

FIG. 5 shows examples of the prototypical 193 nm photoresist formulations shown in FIG. 1 that have been modified to exhibit enhanced e-beam stabilization in accordance with one or more embodiments of the present invention.

DETAILED DESCRIPTION

Figure 1:
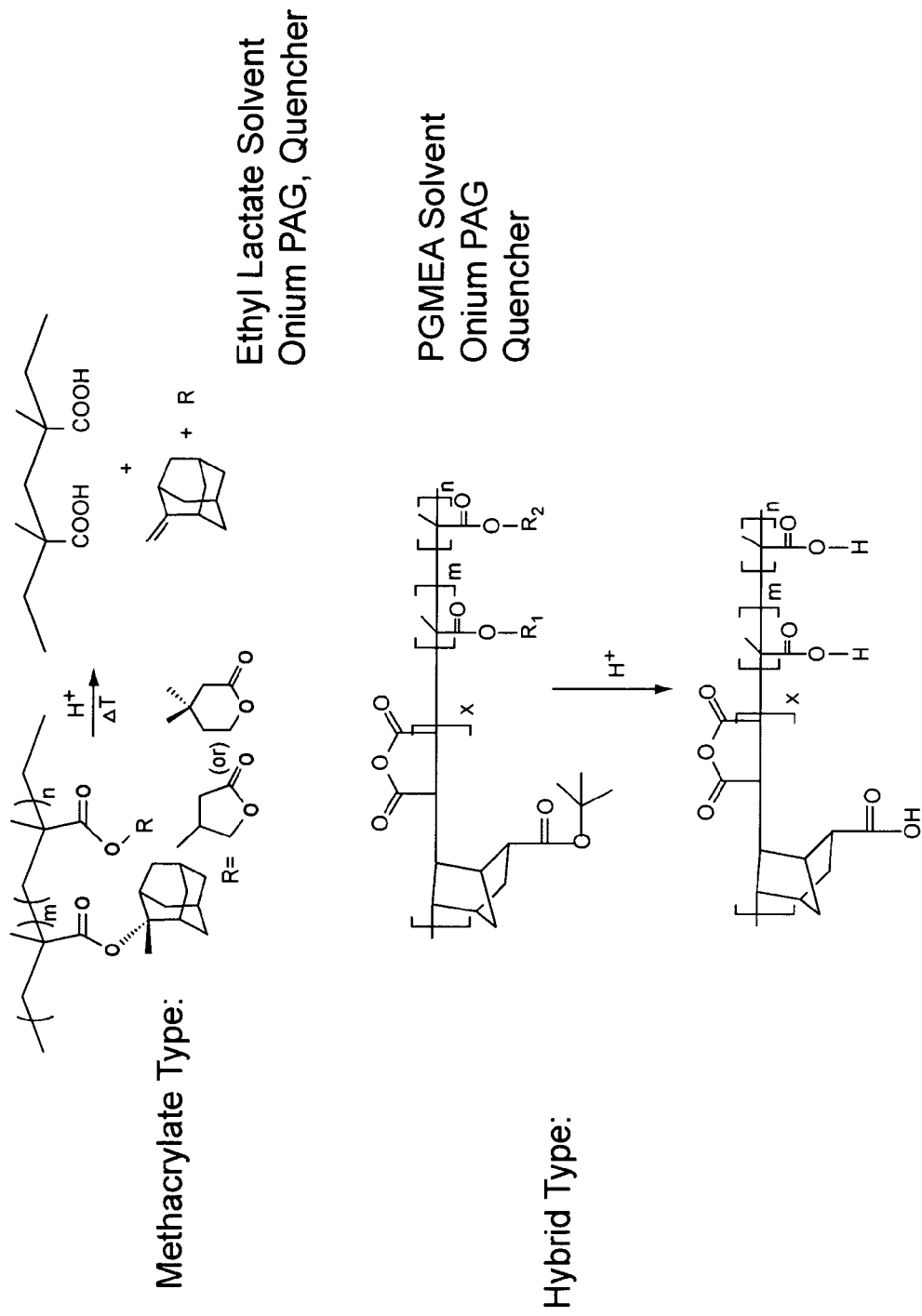
FIG. 1 shows an example of a methacrylate type and a hybrid type chemically amplified photoresist that are fabricated in accordance with the prior art, along an example of a chemical amplification process used with each of them.
Figure 2:
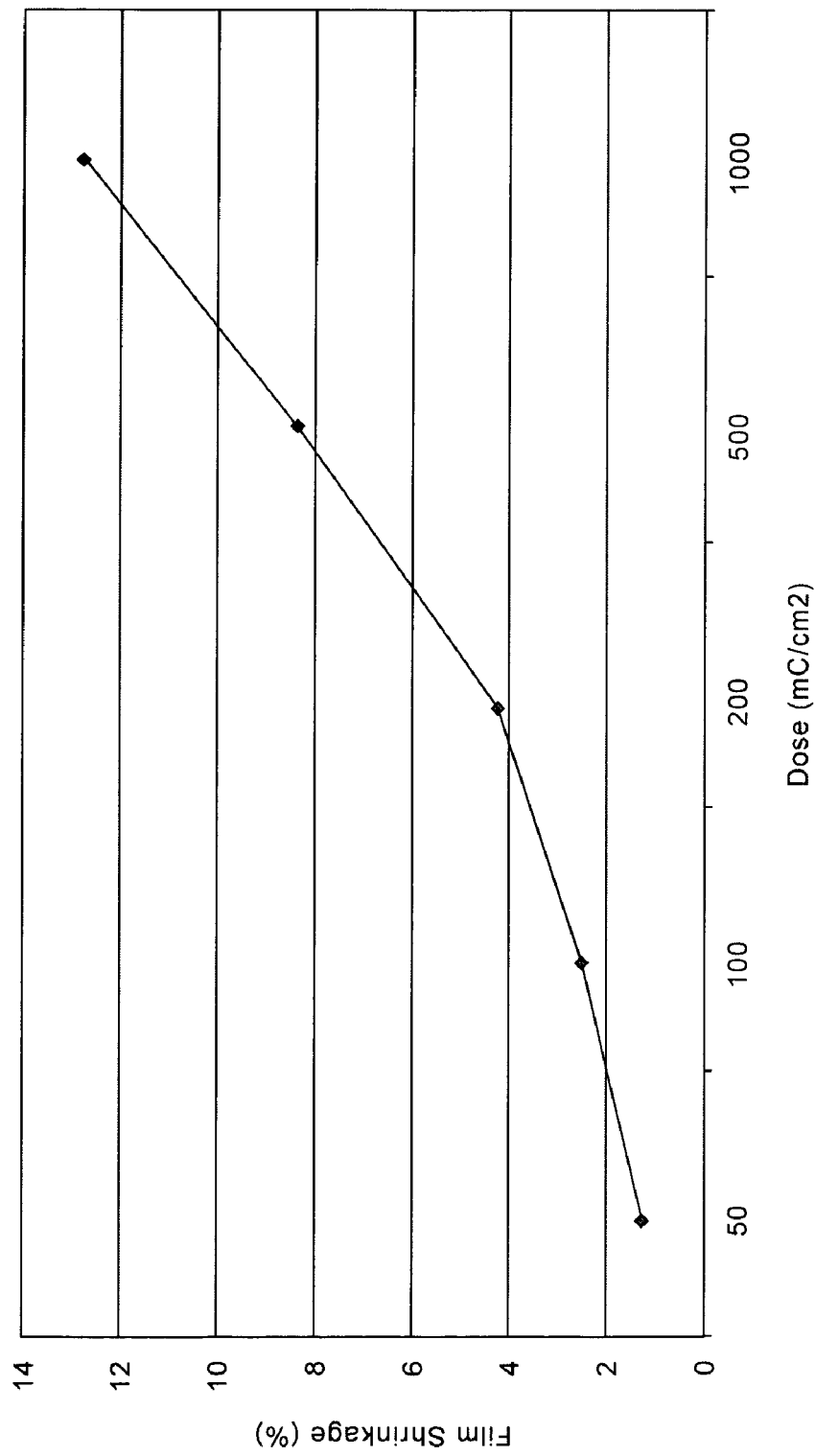
FIGS. 2–3 shows film shrinkage of a 193 nm chemically amplified photoresist as a function of electron beam dose.
Figure 3:
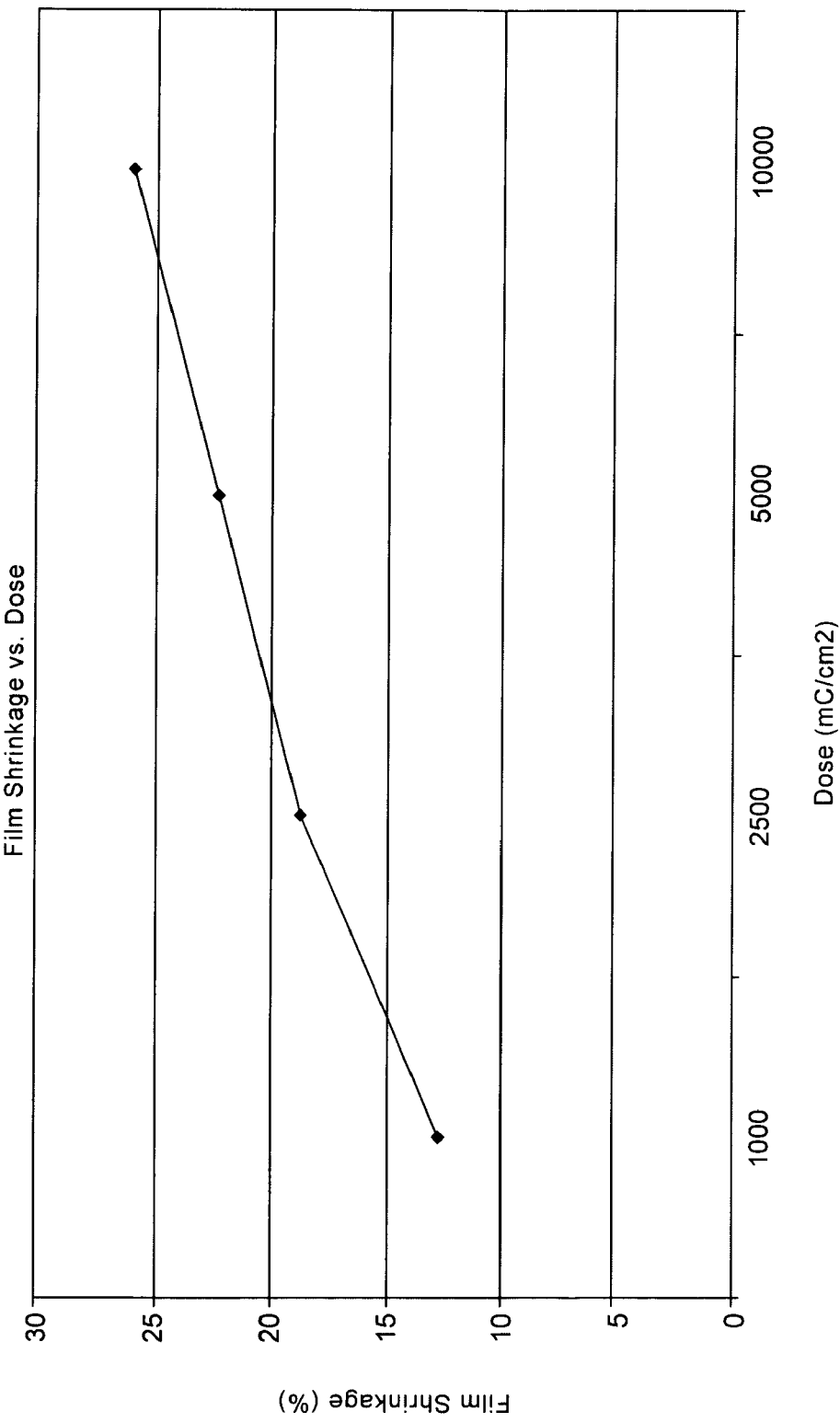
Figure 4:
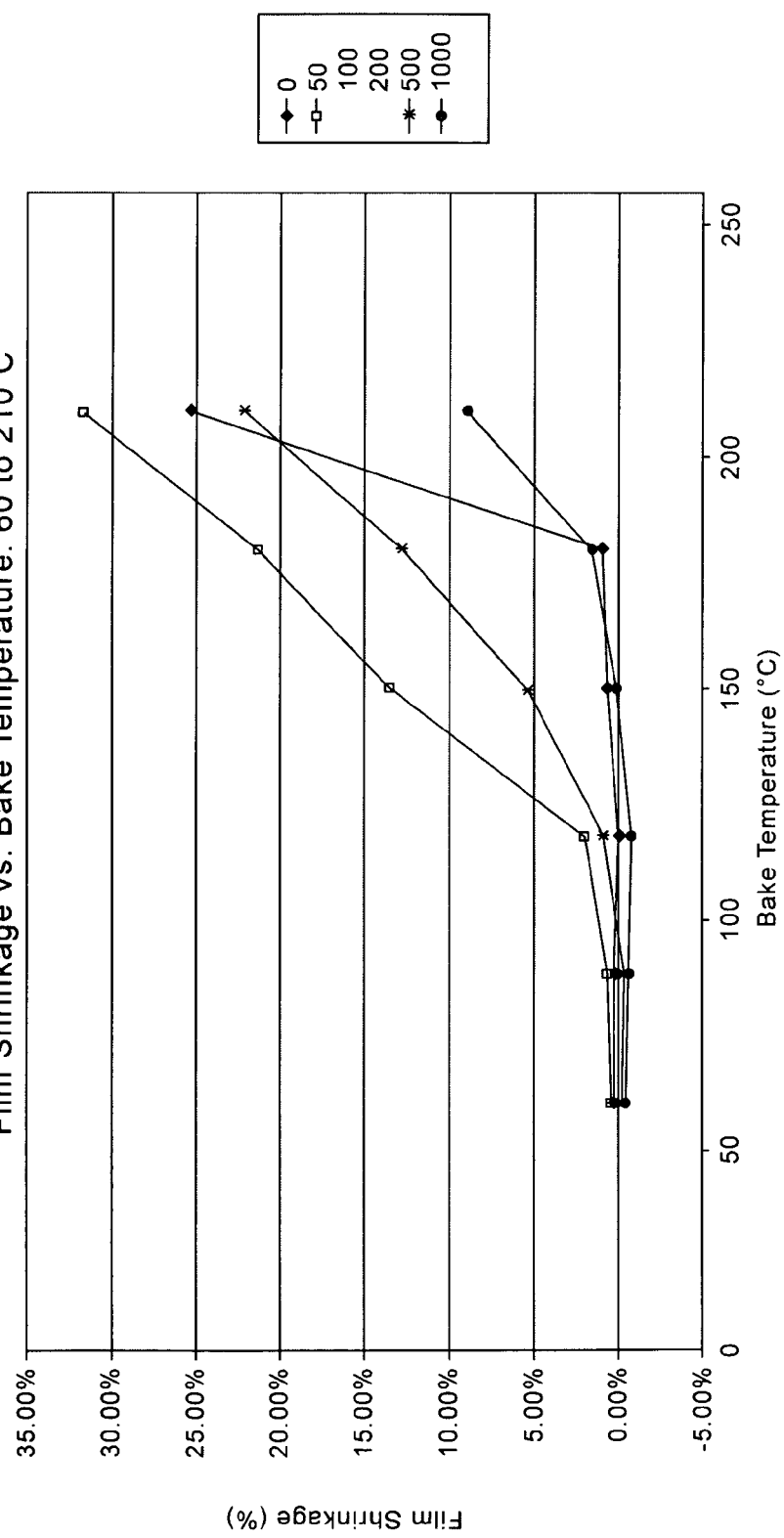
FIG. 4 shows film shrinkage of a 193 nm chemically amplified photoresist as a function of electron beam dose vs. shrinkage as a function of bake temperature.

One or more embodiments of the present invention provide one or more of the following advantages: (a) elimination, or reduction, of photoresist film shrinkage and pullback after electron beam ("e-beam") treatment; (b) elimination, or reduction, of the loss of volatile materials during e-beam treatment (i.e., materials that leave the photoresist film resulting in film shrinkage, and/or contamination of an e-beam treatment chamber); and (c) reduction of e-beam treatment doses required to increase its etch resistance, thereby reducing ablation of photoresist components (which ablation leads to shrinkage).

One or more embodiments of the present invention is a photoresist formulation that includes e-beam cross-linkable substituents that include the following characteristics: (a) the e-beam cross-linkable substituents provide little or no increase in absorption at a particular exposure wavelength used for patterning relative to typical prior art formulations (for example, a transmittance of about or larger than 50% of the transmittance of a typical prior art formulation at useful thicknesses, i.e., thicknesses useful as etch masks for pattern transfer into device layers); (b) the e-beam cross-linkable substituents are relatively stable to the particular exposure wavelength (e.g. 193 nm) used for patterning, and also to photo-generated acids and basic aqueous developers; (c) the e-beam cross-linkable substituents are thermally stable to extended storage of the liquid photoresist formulation, and at temperatures used for pre- and post-exposure bake steps; and (d) the e-beam sensitive substituent must initiate substantial crosslinking of resist features so as to afford improved resistance in a subsequent etch process at doses below those linked to pattern distortion due to shrinkage.

In particular, one or more embodiments of the present invention include a photoresist that includes e-beam crosslinking substituents that satisfy the above-described criteria as exemplified by substituents including one or more of the following functional groups: (a) carbon-carbon double bonds (for example, an alkene functionality built into or attached onto a pendent group (such as an adamantyl cage) or attached either to the pendant group or a polymer; (b) inclusion of "strained" ring systems such as, for example, and without limitation, three (3) or four (4) member cycloalkanes prone to ring opening and cross-linking upon exposure to e-beam irradiation (ideally such moieties are selected from substituents characterized by polymerization with either expansion or no net change in volume, thus countering or minimizing shrinkage); (c) halogenated compounds such as for example, a halomethyl substituent prone to crosslinking under e-beam irradiation through processes correlated with the extrusion of a hydrogen halide (such as, for example, HCl); and (d) one or more organo-silicon moieties (i.e., substituents having Si—C and/or Si—H bonds). From a synthetic strategy, it may prove convenient to incorporate an organo-silicon moiety which itself contains one of the aforementioned substituents, i.e., (a–c) attached either directly to the silicon or to one of the organic substituents attached to silicon.

While the inclusion of silicon into the polymer composition may itself increase resistance to some dry etch processes, it should be noted that it may carry some disadvantage by making the final stripping of the photoresist (following its use as an etch mask) more difficult. Any photoresist material with a substantial silicon content may be prone to self-passivation with an oxide coating and/or to coalescence into silica particles using standard oxygen plasma stripping, thus requiring the addition of a fluorine containing gas such as, for example, and without limitation, $CF_4$.

In accordance with one or more embodiments of the present invention, the e-beam cross-linkable substituents: (a) are appended to or are incorporated into the photoresist backbone; (b) are appended to or are incorporated into photoresist pendant "protecting" groups; and/or (c) are mixed into the photoresist as a dopant material. Note that, when such e-beam cross-linkable substituents are built into the pendant group, it is important that cross-linking processes occur faster (or with greater efficiency) upon e-beam exposure than fragmentation of the pendant substituent.

It should be understood by one of ordinary skill in the art that many different formulations may be fabricated in accordance with the above-described design rules to provide an embodiment of the present invention.

In accordance with one formulation of a 193 nm photoresist, the photoresist is substantially transparent to 193 nm radiation. However, the photoresist contains dopants that (after exposure to the 193 nm radiation) form acids that react with the photoresist (at a post exposure bake temperature, for example, at around 120° C.) to form, for example, an acid that is soluble in a base developer.

In accordance with one or more embodiments of the present invention, a photoresist fabricated in accordance with the above-described design rules to have the above-described functionality is spin-coated onto a wafer in accordance with any one of a number of methods that are well known to those of ordinary skill in the art. Next, the photoresist is baked for example on a hot plate in accordance with any one of a number of methods that are well known to those of ordinary skill in the art. Next, the photoresist is exposed to the 193 nm radiation in a stepper in accordance with any one of a number of methods that are well known to those of ordinary skill in the art. Next, the photoresist is post-exposure baked for example on a hot plate in accordance with any one of a number of methods that are well known to those of ordinary skill in the art. Next, the photoresist is developed in accordance with any one of a number of methods that are well known to those of ordinary skill in the art. Then, the photoresist is e-beam treated using, for example, and without limitation, a chamber like that described below. Advantageously, this e-beam treatment can take place at relatively low doses, for example, doses in a range from about 10 to about 2000 $\mu C/cm^2$, or preferably in a range from about 20 to about 1000 $\mu C/cm^2$, or more preferably in a range from about 100 to about 500 $\mu C/cm^2$. A typical e-beam treatment recipe might be as follows: 4 keV, 12 mA, 500 $\mu C/cm^2$ in $N_2$, at pressure in a range from about 20 to about 70 mTorr.

In accordance with one embodiment of the present invention, a 193 nm photoresist is a methacrylate type or a hybrid type, both of which are shown in FIG. 1. FIG. 5 shows examples of the prototypical 193 nm photoresist formulations shown in FIG. 1 that have been modified to exhibit enhanced e-beam stabilization in accordance with one or more embodiments of the present invention. In particular, FIG. 5 indicates multiple positions for attaching electron beam cross-linking ("EBC") substituents to a resist backbone or pendant group. Useful resist compositions that are fabricated in accordance with one or more embodiments of the present invention may possess EBC substituents in only one or in multiple positions (including some not shown). Examples, without limitation, of suitable EBC substituent groups are: —CH=$CH_2$ (vinyl); —$CH_2$—CH=$CH_2$ (allyl); —(CH—$CH_2$—C)=$CH_2$ (methylene cyclopropane); —$CClH_2$ (chloromethyl); —$CCl_2H$ (dichloromethyl); —Si$(CH_3)_3$ trimethylsilyl; and —SiH$(CH_3)_2$ (dimethylsilyl). It should be understood that this is a partial list of examples provided for clarity only, and that many further embodiments of EBC substituents exist which satisfy the requirements set forth above. In particular, other substituents, or combinations of such other substituents, that satisfy these requirements are also useful in fabricating further embodiments of the present invention.

As used herein, the term electron beam, or e-beam, treatment refers to exposure of a film to a beam of electrons, for example, and without limitation, a relatively uniform beam of electrons. The e-beam may be scanned across a wafer, or the e-beam may be sufficiently broad to encompass a substantial portion, or the entirety, of a wafer (to achieve higher throughput processing it is advantageous to use a large-area or flood beam electron source, to expose the whole substrate simultaneously). The energy of the e-beam during the exposure is such that substantially an entire thickness of a layer of the photoresist material is exposed to electrons from the e-beam, or predetermined portions of the layer beneath the surface of the layer are exposed to electrons from the e-beam. The exposure may also be accomplished in steps of varying energy to enable the whole layer, or portions of the layer to be exposed at predetermined depths.

It is preferred that the e-beam treatment step be conducted using a wide, large beam of electron radiation from a uniform, large-area electron beam source that simultaneously covers the entire substrate area, i.e. an area in a range from about 4 to about 256 square inches. Preferably, an electron beam chamber is used which provides a large area electron source. A suitable electron beam chamber is an ElectronCure™ chamber that is available from Applied Materials, Inc. of Santa Clara, Calif. The principles of operation and performance characteristics of such an apparatus are described in U.S. Pat. No. 5,003,178, the disclosure of which is incorporated herein by reference. The electron beam energy is in a range from about 0.1 to about 100 KeV, and preferably in a range from about 1 to about 12 KeV, and more preferably in a range from about 3 to about 9 KeV. The total dose of electrons is in a range from about 1 to about 500,000 $\mu C/cm^2$, and preferably in a range from about 50 to about 50,000 $\mu C/cm^2$, and more preferably in a range from about 50 to about 5,000 $\mu C/cm^2$ (the dose and energy selected will be proportional to the thickness of the films to be treated). The gas ambient in the electron beam chamber can be any of the following gases: nitrogen, oxygen, hydrogen, argon, xenon, helium, ammonia, silane, a blend of hydrogen and nitrogen, ammonia, or any combination of these gases. The electron beam current is in a range from about 0.1 to about 150 mA, and preferably in a range from about 1 to about 50 mA. The e-beam treatment is conducted while a wafer substrate is under a vacuum, for example, while vacuum conditions are maintained in a range from about $10^{-5}$ to about $10^2$ Torr, and preferably in a range from about $10^{-3}$ to about $10^{-1}$ Torr. The temperature of wafer 27 may vary in a range from about $-100°$ C. to about $200°$ C. In addition, for thick films, the electron beam dose may be divided into steps of decreasing voltage which provides a uniform dose process in which the material is cured from the bottom up. Thus, the depth of electron beam penetration may be varied during the treatment process. The length of the treatment may range from about 0.5 minute to about 120 minutes. As those of ordinary skill in the art can readily appreciate, the length of e-beam treatment may depend one or more of the above-identified parameters, and that particular sets of parameters can be determined routinely without undue experimentation in light of the detailed description presented herein.

Alternative process recipes may be selected with the aim of reducing shrinkage of photoresist due to the activation of photoacid generators by e-beam exposure. This may be accomplished by introducing a basic process gas such as ammonia or a volatile amine compound prior to e-beam treatment. Use of a reactive amine bearing an e-beam crosslinkable functionality, for example allylamine, offers an additional benefit of replacing easily lost protecting groups with e-beam crosslinkable allyl substituted acrylamide moieties. Such a process exemplifies another general strategy for enhancing the etch resistance of existing photoresist formulations through exposure of patterned wafers to (preferably volatile) reagents capable of adsorbing into and (most preferably) reacting with the photoresist matrix prior to e-beam exposure. Finally, both silicon substituents and pendant e-beam active functionality may be introduced by use of appropriate silylating agents such as divinyltetramethyldisilazane, however such process may require prior de-protection of carboxylic acid moieties on the resist, and are subject to the same limitations of other silicon containing formulations discussed above.

It should be understood by those of ordinary skill in the art that although one or more embodiments of the present invention relate to 193 nm photoresist, further embodiments are not to be limited by such disclosures. In fact further embodiments exist that relate to 157 run photoresists, 248 nm photoresists, as well as to chemically amplified photoresists for future lithography generations using extreme ultraviolet and x-ray wavelengths of 1–100 nanometers.

Further, although one or more embodiments of the present invention have been described as relating to photoresists, further embodiments of the present invention also relate to electron beam sensitive resists.

Those skilled in the art will recognize that the foregoing description has been presented for the sake of illustration and description only. As such, it is not intended to be exhaustive or to limit the invention to the precise form disclosed. For example, although certain dimensions were discussed above, they are merely illustrative since various designs may be fabricated using the embodiments described above, and the actual dimensions for such designs will be determined in accordance with circuit requirements. In addition, the term substrates include those suitable to be processed into an integrated circuit or other microelectronic device, and is used in the broadest sense of the word. Suitable substrates for the present invention non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon oxide and combinations mixtures thereof. The term substrates also include glass substrates of any kind.

What is claimed is:

1. A positive photoresist formulation comprising:
   a positive photoresist material that is capable of forming a positive image by exposure to radiation, the positive photoresist material comprising e-beam cross-linkable substituents, which substituents include one or more of the following functional groups:
   a strained ring system comprising three (3) or four (4) member cycloalkanes;
   a halogenated compound having a halomethyl substituent; and
   one or more organo-silicon moieties comprising substituents having Si—C and/or Si—H bonds.

2. The positive photoresist formulation of claim 1 wherein the e-beam cross-linkable substituents comprise carbon-carbon double bonds having an alkene functionality.

3. The positive photoresist formulation of claim 2 wherein the alkene functionality is built into or attached onto a pendant group or is attached to a polymer.

4. The positive photoresist formulation of claim 1 wherein the e-beam cross-linkable substituents: (a) are appended to or are incorporated into a backbone of the positive photoresist material; (b) are appended to or are incorporated into photoresist pendant protecting groups; and/or (c) are mixed into the photoresist formulation as a dopant material.

5. The positive photoresist formulation of claim 4 wherein e-beam cross-linkable substituents are appended in one or more positions.

6. The positive photoresist formulation of claim 1 wherein radiation exposed areas of the photoresist material are rendered soluble in a developer, and wherein the non-radiation exposed areas are capable of being treated by a beam of electrons to initiate cross-linking in the e-beam cross-linkable substituents. thereby increasing the etch resistance on the non-radiation exposed areas.

7. The positive photoresist formulation of claim 6 wherein the radiation exposed areas of the photoresist material are capable of being dissolved in the developer while the non-radiation exposed areas are substantially unaffected by the developer, thereby forming a pattern of the radiation and non-radiation exposed areas comprising the positive image.

8. A positive photoresist formulation comprising:
   a positive photoresist material that is capable of forming a positive image by exposure to radiation, the positive photoresist material comprising an organosilicon moiety comprising silicon, the organosilicon moiety having one or more of (ii) carbon-carbon double bonds, (ii) strained ring systems, and (iii) halogenated compounds that are attached either directly to the silicon or to an organic substituent attached to the silicon.

9. A positive photoresist formulation comprising:
   a positive photoresist material that Is capable of forming a positive image by exposure to radiation, the positive photoresist material comprising an e-beam cross-linkable substituent that includes a strained ring system comprising three (3) or four (4) member cycloalkanes.

10. A positive photoresist formulation comprising:
    a positive photoresist material that is capable of forming a positive image by exposure to radiation, the positive photoresist material comprising an e-beam cross-linkable substituent that includes a halogenated compound having a halomethyl substituent.

11. A positive photoresist formulation comprising:
    a positive photoresist material that is capable of forming a positive image by exposure to radiation, the positive photoresist material comprising an e-beam cross-linkable substituent that includes a organo-silicon moiety comprising substituents having Si—C and/or Si—H bonds.

* * * * *